United States Patent [19]

Chen

[11] Patent Number: 5,755,580

[45] Date of Patent: May 26, 1998

[54] UNIVERSAL CABLE CONNECTING BOX FOR VEHICLES

[76] Inventor: Shou-Shan Chen, 2nd Fl., No. 20, Lane 78, Fu Hsing Road, Taipei City, Taiwan

[21] Appl. No.: 656,927

[22] Filed: Jun. 3, 1996

[51] Int. Cl.[6] ..................................................... H01R 9/09
[52] U.S. Cl. ............................................. 439/76.2; 361/777
[58] Field of Search .................................. 439/76.1, 76.2, 439/949; 361/826, 728, 748, 775, 777, 760

[56] References Cited

U.S. PATENT DOCUMENTS

| | | | |
|---|---|---|---|
| 3,033,914 | 5/1962 | Acosta-Lleras | 361/777 |
| 3,621,116 | 11/1971 | Adams | 361/777 |
| 3,728,471 | 4/1973 | Blinkhorn | 361/777 |
| 5,023,752 | 6/1991 | Detter et al. | 439/76.2 |
| 5,145,414 | 9/1992 | Oikawa | 439/374 |

Primary Examiner—Neil Abrams
Assistant Examiner—T. C. Patel

[57] ABSTRACT

A universal cable connecting box for a vehicle is disclosed. The cable connecting box includes a box body and a circuit board mounted in the box. Multiple groups of connectors are soldered on soldered points of the circuit board as a matrix. The soldered points of the same row are interconnected with each other, while the soldered points of different rows are isolated from each other. Common cables of different equipments of the car are connected in the same connector so as to simplify the layout and connection of the cables and collectively manage the cables for facilitating later service work.

2 Claims, 3 Drawing Sheets

UNIVERSAL CABLE CONNECTING BOX FOR VEHICLES

BACKGROUND OF THE INVENTION

The present invention relates to a universal cable connecting box which simplifies the cable layout and connection in a vehicle and collectively manages the cables for facilitating installation and later service work.

Nowadays, a modern car is optionally equipped with more and more equipments for achieving more comfort and ensuring safety. Almost all such equipments are electrically activated. As shown in FIG. 1, the conventional control circuit 1 of a car may incorporate various optional equipments, such as a burglar-proof device 10, a remote control starting device 20, a speech device 30, a car condition displaying system 40, a globe positioning system 50, and a telephone remote control burglar-proof system 100, etc. Usually, the car owner selectively adds these equipments to the control circuit 1 not at a time. As a result, the wiring cables in the car cannot be tidily managed and are often arranged at random. For example, in case a burglar-proof device 10 necessitates 16 cables and a remote control starting device 20 necessitates 11 cables, then it will require 27 cables to connect these equipments to the original control circuit in total. If additional equipments are further added to the car, the arrangement of the cables in the car will become more random and difficult. This also leads to difficulty in finding the proper wiring cable in later service of any of the equipments. Moreover, the power supplying cables of these cables will be subject to short circuit in case of improper connection. This will result in damage of the battery or even burning down of the car. Furthermore, the complicated terminals of the cables of the conventional control circuit 1 often result in poor electrical contact of the cables.

SUMMARY OF THE INVENTION

It is therefore a primary object of the present invention to provide a car-used universal cable connecting box in which by means of the arranged connectors and soldered copper foil of the circuit board, the common cables of the equipments of the car can be connected to the same connector so that the consumption of connector parts may be reduced and the circuit layout may be simplified.

It is a further object of the present invention to provide an useful cable connecting box in which the in-car cables are collected in the universal cable connecting box so that the usage and path of the cables can be effectively managed to facilitate installation and identification for the service man and save installation and service time.

It is still a further object of the present invention to provide the above cable connecting box in which a fuse is disposed at the power end of each row of connectors for protecting the equipment. This also helps in removal and diagnosis of failure.

The present invention can be best understood through the following description and accompanying drawing, wherein:

DETAILED DESCRIPTION OF THE PREFERRED EMBODIMENT

Figure 1:
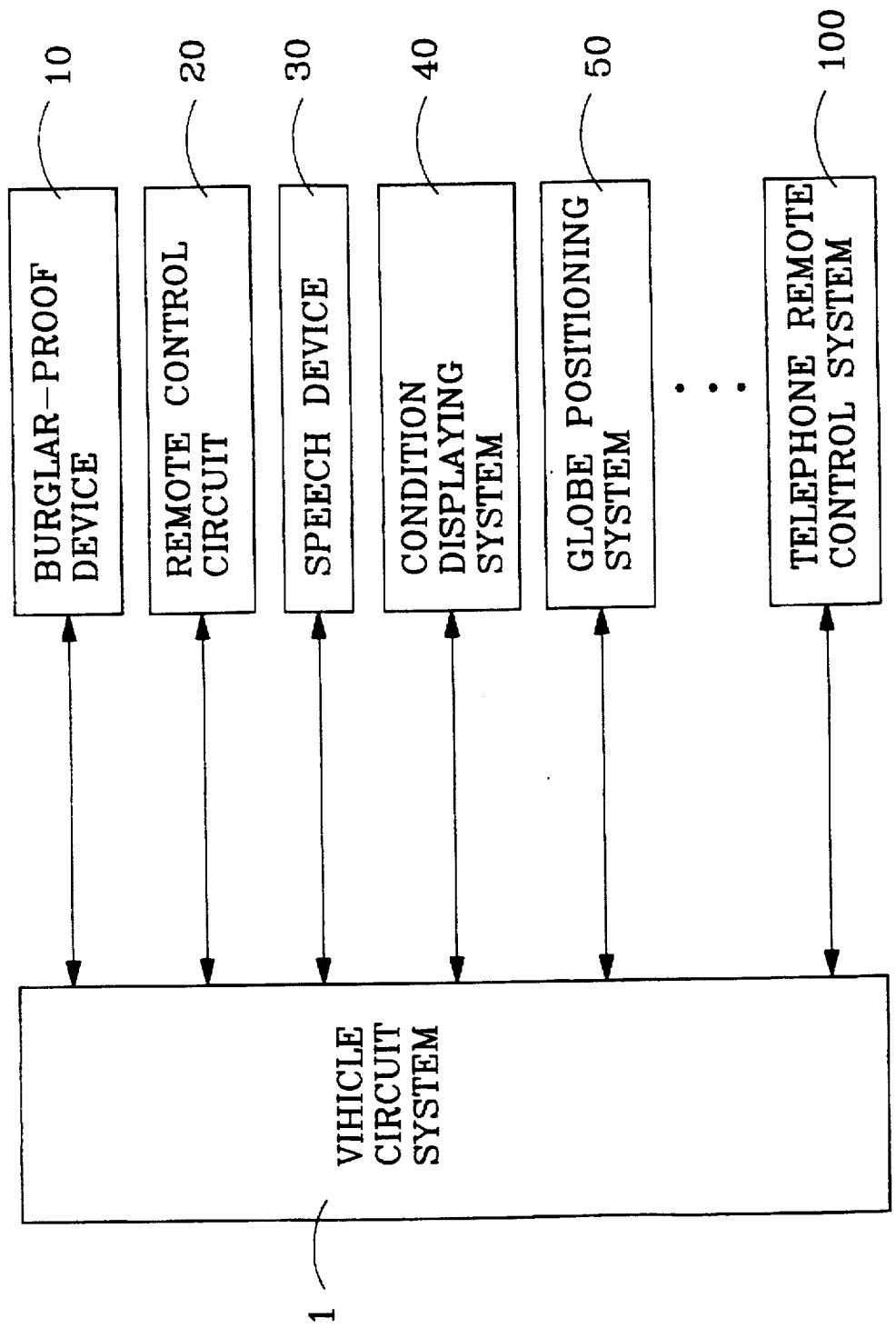
FIG. 1 is a schematic functional block diagram showing that a car circuit incorporates a various optional equipments.
Figure 2:
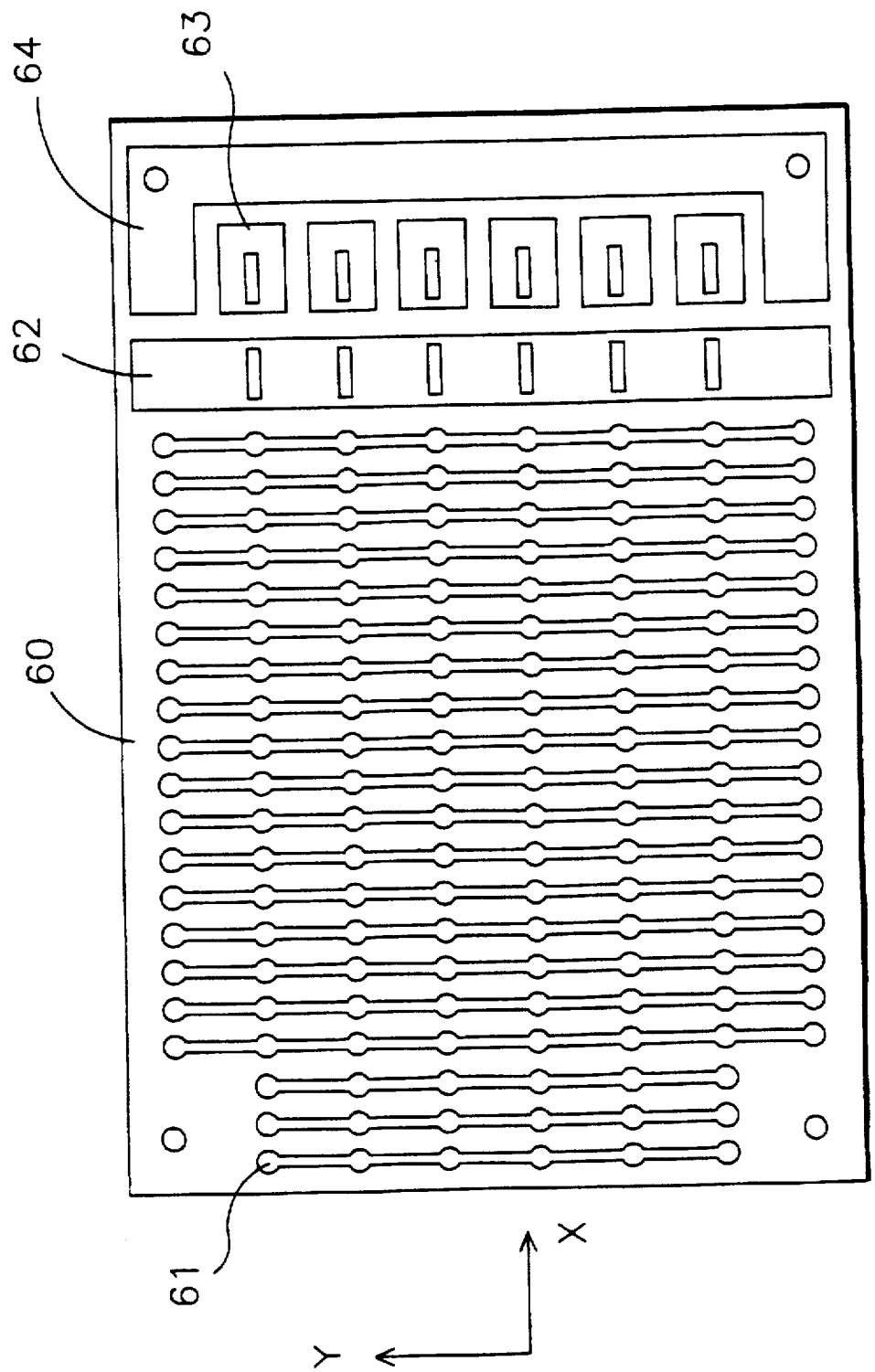
FIG. 2 shows the layout on the soldered surface of the circuit board of the universal cable connecting box in accordance with a preferred embodiment of the present invention.
Figure 3:
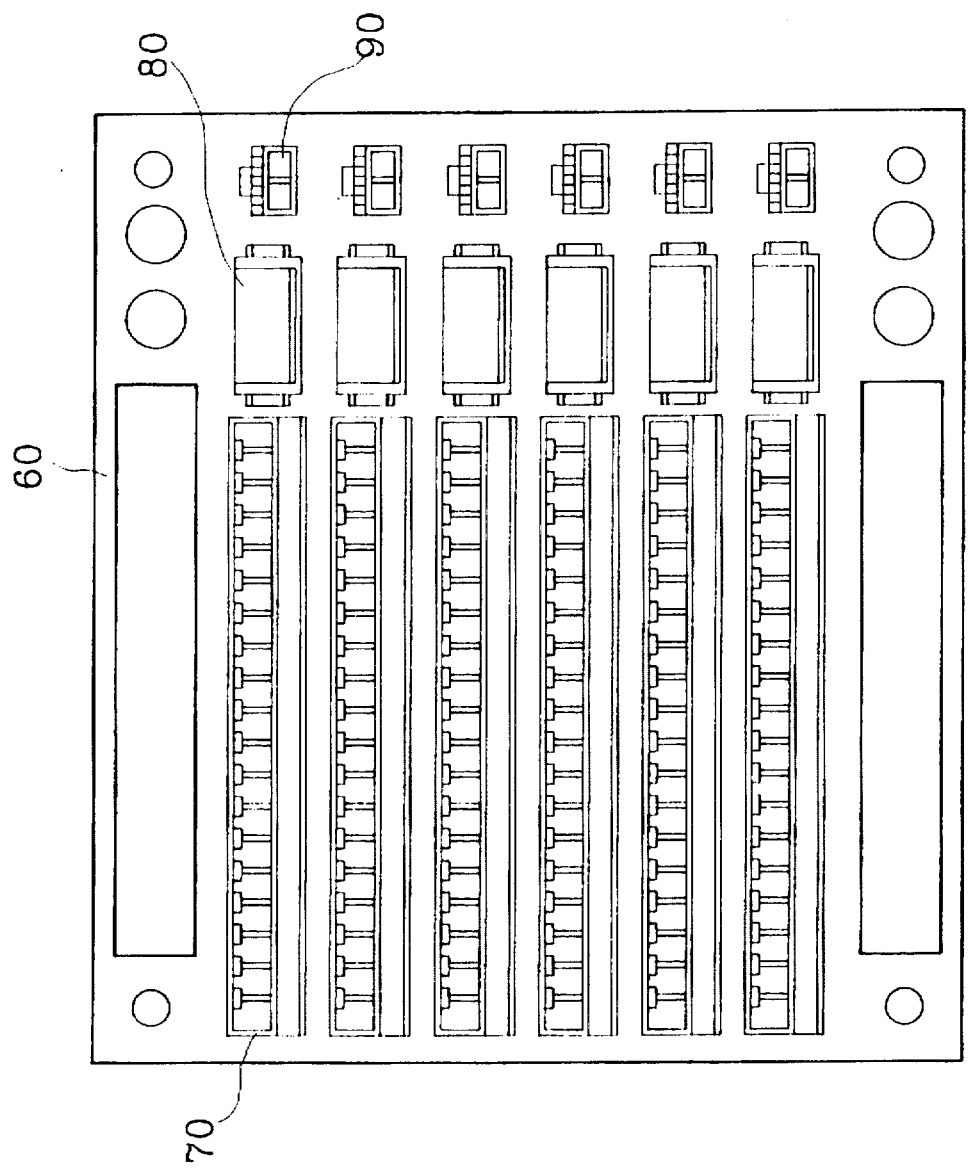
FIG. 3 shows the arrangement of the component mounting surface of the circuit board of the present invention.

Please refer to FIG. 2 which shows the layout of the circuit board of the universal cable connecting box in accordance with a preferred embodiment of the present invention. An array of copper foils are arranged on the circuit board 60 as a matrix pattern. Several rows of soldered points 61 are disposed in X axis direction. Each row of soldered points 61 includes multiple independent soldered points. Multiple strips of copper foils are disposed in Y axis direction to interconnect the soldered points 61 on the same line. Accordingly, the soldered points 61 along X axis are disconnected from each other, while the soldered points along Y axis are interconnected with each other. On right side of the circuit board 60 are disposed a power source input contact 62, a power source output contact 63 and a grounding contact 64. The power input contact 62 is connected to a positive end of a power source, such as a battery. A fuse seat 80 (as shown in FIG. 3) is disposed between the power input contact 62 and the power output contact 63. The grounding contact 64 is connected to a grounding end of the battery.

Please refer to FIG. 3 which shows the arrangement of the components mounting plane of the circuit board 60. When soldered, a plurality of connectors 70 are located in the X axis soldered points 61 and soldered with the circuit board on the other face thereof. The fuse seat 80 is soldered between the power input contact 62 and the power output contact 63. Then a power socket 90 is soldered between the grounding contact 64 and the power output contact 63. In such a design, the respective signal lines and power cables of the equipments of the car may be one by one inserted into the connectors 70. Therefore, the cables can be connected in a simple, convenient and time-saving manner. The above circuit board 60 can be received in a box or housing (not shown).

Therefore, the consumption of cable material is reduced and the in-car layout is simplified. Moreover, the usage and path of the cables can be effectively managed to facilitate installation and identification for the service man. Accordingly, the installation and service time can be greatly saved.

In conclusion, the present invention has the following advantages:

1. By means of the array of connectors and soldered copper foil of the circuit board, the common cables of the equipments of the car can be connected to the same connector so that the consumption of cable material is reduced and the in-car layout is simplified.

2. The in-car cables are collected in the universal cable connecting box so that the usage and path of the cables can be effectively managed to facilitate installation and identification for the service man. Accordingly, the installation and service time can be greatly saved. The cable connecting box can be mounted in a position of the equipment panel of the car.

3. A fuse is disposed at the power end of each row of connectors for protecting each equipment. This also helps in removal and diagnosis of failure.

It is to be understood that the above description and drawings are only used for illustrating one embodiment of the present invention, not intended to limit the scope thereof. Any variation and derivation from the above description and drawings should be included in the scope of the present invention.

I claim:

1. A cable connecting box for collecting cables of various equipments in a vehicle to reduce cable connections of the vehicle, the cable connecting box being provided with a circuit board having a solder surface and a component mounting surface, comprising:

several rows of solder points arranged on the solder surface of the circuit board in alignment in X axis direction;

a plurality of strips of copper foils arranged in Y axis direction on the component mounting surface of the circuit board to interconnect the solder points on the same line so that the solder points along X axis are isolated from each other while the solder points along Y axis are interconnected with each other;

a power input contact area formed on a side area of the solder surface of the circuit board;

a power output contact area formed on the solder surface of the circuit board, adjacent to the power input contract area;

a grounding contact area formed on the solder surface of the circuit board, adjacent to the power output contact area;

a plurality of fuse seats disposed on the component mounting surface of the circuit board and soldered between the power input contact area and the power output contact area respectively; and a plurality of connectors arranged on the component mounting surface of the circuit board in X axis direction, each of the connectors having a plurality of extended connecting pins soldered on the solder points on the solder surface of the circuit board respectively.

2. The cable connecting box as claimed in claim 1, further comprising a plurality of power sockets disposed on the component mounting surface of the circuit board and soldered between the grounding contact and the power output contact respectively.

* * * * *